United States Patent
Shifren et al.

(10) Patent No.: US 8,421,162 B2
(45) Date of Patent: Apr. 16, 2013

(54) ADVANCED TRANSISTORS WITH PUNCH THROUGH SUPPRESSION

(75) Inventors: Lucian Shifren, San Jose, CA (US); Pushkar Ranade, Los Gatos, CA (US); Paul E. Gregory, Palo Alto, CA (US); Sachin R. Sonkusale, Los Gatos, CA (US); Weimin Zhang, Campbell, CA (US); Scott E. Thompson, Gainesville, FL (US)

(73) Assignee: Suvolta, Inc., Los Gatos, CA (US)

( * ) Notice: Subject to any disclaimer, the term of this patent is extended or adjusted under 35 U.S.C. 154(b) by 56 days.

(21) Appl. No.: 12/895,813

(22) Filed: Sep. 30, 2010

(65) Prior Publication Data

US 2011/0121404 A1     May 26, 2011

Related U.S. Application Data

(60) Provisional application No. 61/247,300, filed on Sep. 30, 2009, provisional application No. 61/262,122, filed on Nov. 17, 2009, provisional application No. 61/357,492, filed on Jun. 22, 2010.

(51) Int. Cl.
*H01L 29/772* (2006.01)
*H01L 21/336* (2006.01)

(52) U.S. Cl.
USPC ............... 257/392; 257/402; 257/E21.409; 257/E29.242; 438/289; 438/301

(58) Field of Classification Search ............ 257/336, 257/344, 345, 392, 402, 404, 408, E21.409, 257/E29.242, E29.255, E29.266, E29.268; 438/194, 197, 199, 282, 289–291, 299, 301, 438/305, 393, 407, 528
See application file for complete search history.

(56) References Cited

U.S. PATENT DOCUMENTS

| 3,958,266 A | 5/1976 | Athanas |
| 4,000,504 A | 12/1976 | Berger |
| 4,021,835 A | 5/1977 | Etoh et al. |

(Continued)

FOREIGN PATENT DOCUMENTS

| EP | 0274278 | 7/1988 |
| EP | 0312237 | 4/1989 |

(Continued)

OTHER PUBLICATIONS

Matsuhashi et al., "High-performance double-layer epitaxial-channel PMOSFET compatible with a single gate CMOSFET", Proceedings of 1996 VLSI Symp. on VLSI Tech., pp. 36-37.*

(Continued)

*Primary Examiner* — Walter H Swanson
(74) *Attorney, Agent, or Firm* — Baker Botts L.L.P.

(57) ABSTRACT

An advanced transistor with punch through suppression includes a gate with length Lg, a well doped to have a first concentration of a dopant, and a screening region positioned under the gate and having a second concentration of dopant. The second concentration of dopant may be greater than $5 \times 10^{18}$ dopant atoms per $cm^3$. At least one punch through suppression region is disposed under the gate between the screening region and the well. The punch through suppression region has a third concentration of a dopant intermediate between the first concentration and the second concentration of dopant. A bias voltage may be applied to the well region to adjust a threshold voltage of the transistor.

8 Claims, 5 Drawing Sheets

U.S. PATENT DOCUMENTS

| | | | |
|---|---|---|---|
| 4,242,691 A | 12/1980 | Kotani et al. |
| 4,276,095 A | 6/1981 | Beilstein, Jr. et al. |
| 4,315,781 A | 2/1982 | Henderson |
| 4,518,926 A | 5/1985 | Swanson |
| 4,559,091 A | 12/1985 | Allen et al. |
| 4,578,128 A | 3/1986 | Mundt et al. |
| 4,617,066 A | 10/1986 | Vasudev |
| 4,662,061 A | 5/1987 | Malhi |
| 4,761,384 A | 8/1988 | Neppl et al. |
| 4,780,748 A | 10/1988 | Cunningham et al. |
| 4,819,043 A | 4/1989 | Yazawa et al. |
| 4,885,477 A | 12/1989 | Bird et al. |
| 4,908,681 A | 3/1990 | Nishida et al. |
| 4,945,254 A | 7/1990 | Robbins |
| 4,956,311 A | 9/1990 | Liou et al. |
| 5,034,337 A | 7/1991 | Mosher et al. |
| 5,144,378 A | 9/1992 | Hikosaka |
| 5,156,989 A | 10/1992 | Williams et al. |
| 5,156,990 A | 10/1992 | Mitchell |
| 5,166,765 A | 11/1992 | Lee et al. |
| 5,208,473 A | 5/1993 | Komori et al. |
| 5,294,821 A | 3/1994 | Iwamatsu |
| 5,298,763 A | 3/1994 | Shen et al. |
| 5,369,288 A | 11/1994 | Usuki |
| 5,373,186 A | 12/1994 | Schubert et al. |
| 5,384,476 A | 1/1995 | Nishizawa et al. |
| 5,426,328 A * | 6/1995 | Yilmaz et al. ............... 257/552 |
| 5,444,008 A | 8/1995 | Han et al. |
| 5,552,332 A | 9/1996 | Tseng et al. |
| 5,559,368 A | 9/1996 | Hu et al. |
| 5,608,253 A | 3/1997 | Liu et al. |
| 5,622,880 A | 4/1997 | Burr et al. |
| 5,624,863 A | 4/1997 | Helm et al. |
| 5,625,568 A | 4/1997 | Edwards et al. |
| 5,641,980 A | 6/1997 | Yamaguchi et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,726,562 A | 3/1998 | Mizuno |
| 5,731,626 A | 3/1998 | Eaglesham et al. |
| 5,736,419 A | 4/1998 | Naem |
| 5,753,555 A | 5/1998 | Hada |
| 5,754,826 A | 5/1998 | Gamal et al. |
| 5,756,365 A | 5/1998 | Kakumu |
| 5,763,921 A | 6/1998 | Okumura et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,885,876 A | 3/1999 | Dennen |
| 5,889,315 A | 3/1999 | Farrenkopf et al. |
| 5,895,954 A | 4/1999 | Yasumura et al. |
| 5,899,714 A | 5/1999 | Farremkopf et al. |
| 5,918,129 A | 6/1999 | Fulford, Jr. et al. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin et al. |
| 5,985,705 A * | 11/1999 | Seliskar ............... 438/197 |
| 5,989,963 A | 11/1999 | Luning et al. |
| 6,001,695 A | 12/1999 | Wu |
| 6,020,227 A | 2/2000 | Bulucea |
| 6,043,139 A | 3/2000 | Eaglesham et al. |
| 6,060,345 A | 5/2000 | Hause et al. |
| 6,060,364 A | 5/2000 | Maszara et al. |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,153,920 A | 11/2000 | Gossmann et al. |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,198,157 B1 | 3/2001 | Ishida et al. |
| 6,218,892 B1 | 4/2001 | Soumyanath et al. |
| 6,218,895 B1 | 4/2001 | De et al. |
| 6,221,724 B1 | 4/2001 | Yu et al. |
| 6,229,188 B1 | 5/2001 | Aoki et al. |
| 6,232,164 B1 | 5/2001 | Tsai et al. |
| 6,235,597 B1 | 5/2001 | Miles |
| 6,245,618 B1 | 6/2001 | An et al. |
| 6,268,640 B1 | 7/2001 | Park et al. |
| 6,271,070 B2 | 8/2001 | Kotani et al. |
| 6,271,551 B1 | 8/2001 | Schmitz et al. |
| 6,288,429 B1 | 9/2001 | Iwata et al. |
| 6,297,132 B1 | 10/2001 | Zhang et al. |
| 6,300,177 B1 | 10/2001 | Sundaresan et al. |
| 6,313,489 B1 | 11/2001 | Letavic et al. |
| 6,319,799 B1 | 11/2001 | Ouyang et al. |
| 6,320,222 B1 | 11/2001 | Forbes et al. |
| 6,323,525 B1 | 11/2001 | Noguchi et al. |
| 6,326,666 B1 | 12/2001 | Bernstein et al. |
| 6,335,233 B1 | 1/2002 | Cho et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,260 B1 | 7/2002 | Hshieh |
| 6,426,279 B1 | 7/2002 | Huster et al. |
| 6,432,754 B1 | 8/2002 | Assaderaghi et al. |
| 6,444,550 B1 | 9/2002 | Hao et al. |
| 6,444,551 B1 | 9/2002 | Ku et al. |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall et al. |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,503,805 B2 | 1/2003 | Wang et al. |
| 6,506,640 B1 | 1/2003 | Ishida et al. |
| 6,518,623 B1 | 2/2003 | Oda et al. |
| 6,521,470 B1 | 2/2003 | Lin et al. |
| 6,534,373 B1 | 3/2003 | Yu |
| 6,541,328 B2 | 4/2003 | Whang et al. |
| 6,541,829 B2 | 4/2003 | Nishinohara et al. |
| 6,548,842 B1 | 4/2003 | Bulucea et al. |
| 6,551,885 B1 | 4/2003 | Yu |
| 6,552,377 B1 | 4/2003 | Yu |
| 6,573,129 B2 | 6/2003 | Hoke et al. |
| 6,576,535 B2 | 6/2003 | Drobny et al. |
| 6,600,200 B1 | 7/2003 | Lustig et al. |
| 6,620,671 B1 | 9/2003 | Wang et al. |
| 6,624,488 B1 | 9/2003 | Kim |
| 6,627,473 B1 | 9/2003 | Oikawa et al. |
| 6,630,710 B1 | 10/2003 | Augusto |
| 6,660,605 B1 | 12/2003 | Liu |
| 6,662,350 B2 | 12/2003 | Fried et al. |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,743,684 B2 | 6/2004 | Liu |
| 6,751,519 B1 | 6/2004 | Satya et al. |
| 6,753,230 B2 | 6/2004 | Sohn et al. |
| 6,760,900 B2 | 7/2004 | Rategh et al. |
| 6,770,944 B2 | 8/2004 | Nishinohara |
| 6,787,424 B1 | 9/2004 | Yu |
| 6,797,553 B2 | 9/2004 | Adkisson et al. |
| 6,797,602 B1 | 9/2004 | Kluth et al. |
| 6,797,994 B1 | 9/2004 | Hoke et al. |
| 6,808,004 B2 | 10/2004 | Kamm et al. |
| 6,808,994 B1 | 10/2004 | Wang |
| 6,813,750 B2 | 11/2004 | Usami et al. |

| Patent | Type | Date | Inventor |
|---|---|---|---|
| 6,821,825 | B2 | 11/2004 | Todd et al. |
| 6,821,852 | B2 | 11/2004 | Rhodes |
| 6,822,297 | B2 | 11/2004 | Nandakumar et al. |
| 6,831,292 | B2 | 12/2004 | Currie et al. |
| 6,835,639 | B2 | 12/2004 | Rotondaro et al. |
| 6,852,602 | B2 | 2/2005 | Kanzawa et al. |
| 6,852,603 | B2 | 2/2005 | Chakravarthi et al. |
| 6,881,641 | B2 | 4/2005 | Wieczorek et al. |
| 6,881,987 | B2 | 4/2005 | Sohn |
| 6,891,439 | B2 | 5/2005 | Jachne et al. |
| 6,893,947 | B2 | 5/2005 | Martinez et al. |
| 6,900,519 | B2 | 5/2005 | Cantell et al. |
| 6,901,564 | B2 | 5/2005 | Stine et al. |
| 6,916,698 | B2 | 7/2005 | Mocuta et al. |
| 6,917,237 | B1 | 7/2005 | Tschanz et al. |
| 6,927,463 | B2 | 8/2005 | Iwata et al. |
| 6,928,128 | B1 | 8/2005 | Sidiropoulos |
| 6,930,007 | B2 | 8/2005 | Bu et al. |
| 6,930,360 | B2 | 8/2005 | Yamauchi et al. |
| 6,957,163 | B2 | 10/2005 | Ando |
| 6,963,090 | B2 | 11/2005 | Passlack et al. |
| 6,995,397 | B2 | 2/2006 | Yamashita et al. |
| 7,002,214 | B1 | 2/2006 | Boyd et al. |
| 7,008,836 | B2 | 3/2006 | Algotsson et al. |
| 7,015,546 | B2 | 3/2006 | Herr et al. |
| 7,015,741 | B2 | 3/2006 | Tschanz et al. |
| 7,022,559 | B2 | 4/2006 | Barnak et al. |
| 7,036,098 | B2 | 4/2006 | Eleyan et al. |
| 7,038,258 | B2 | 5/2006 | Liu et al. |
| 7,039,881 | B2 | 5/2006 | Regan |
| 7,045,456 | B2 | 5/2006 | Murto et al. |
| 7,057,216 | B2 | 6/2006 | Ouyang et al. |
| 7,061,058 | B2 | 6/2006 | Chakravarthi et al. |
| 7,064,039 | B2 | 6/2006 | Liu |
| 7,064,399 | B2 | 6/2006 | Babcock et al. |
| 7,071,103 | B2 | 7/2006 | Chan et al. |
| 7,078,325 | B2 | 7/2006 | Curello et al. |
| 7,078,776 | B2 | 7/2006 | Nishinohara et al. |
| 7,089,513 | B2 | 8/2006 | Bard et al. |
| 7,089,515 | B2 | 8/2006 | Hanafi et al. |
| 7,091,093 | B1 | 8/2006 | Noda et al. |
| 7,105,399 | B1 | 9/2006 | Dakshina-Murthy et al. |
| 7,109,099 | B2 | 9/2006 | Tan et al. |
| 7,119,381 | B2 | 10/2006 | Passlack |
| 7,122,411 | B2 | 10/2006 | Mouli |
| 7,127,687 | B1 | 10/2006 | Signore |
| 7,132,323 | B2 | 11/2006 | Haensch et al. |
| 7,169,675 | B2 | 1/2007 | Tan et al. |
| 7,170,120 | B2 | 1/2007 | Datta et al. ............... 257/288 |
| 7,176,137 | B2 | 2/2007 | Perug et al. |
| 7,186,598 | B2 | 3/2007 | Yamauchi et al. |
| 7,189,627 | B2 | 3/2007 | Wu et al. |
| 7,199,430 | B2 | 4/2007 | Babcock et al. |
| 7,202,517 | B2 | 4/2007 | Dixit et al. |
| 7,208,354 | B2 | 4/2007 | Bauer |
| 7,211,871 | B2 | 5/2007 | Cho |
| 7,221,021 | B2 | 5/2007 | Wu et al. |
| 7,223,646 | B2 | 5/2007 | Miyashita et al. |
| 7,226,833 | B2 | 6/2007 | White et al. |
| 7,226,843 | B2 | 6/2007 | Weber et al. |
| 7,230,680 | B2 | 6/2007 | Fujisawa et al. |
| 7,235,822 | B2 | 6/2007 | Li |
| 7,256,639 | B1 | 8/2007 | Koniaris et al. |
| 7,259,428 | B2 | 8/2007 | Inaba |
| 7,260,562 | B2 | 8/2007 | Czajkowski et al. |
| 7,294,877 | B2 | 11/2007 | Rueckes et al. |
| 7,297,994 | B2 | 11/2007 | Wieczorek et al. |
| 7,301,208 | B2 | 11/2007 | Handa et al. |
| 7,304,350 | B2 | 12/2007 | Misaki |
| 7,307,471 | B2 | 12/2007 | Gammie et al. |
| 7,312,500 | B2 | 12/2007 | Miyashita et al. |
| 7,323,754 | B2 | 1/2008 | Ema et al. |
| 7,332,439 | B2 | 2/2008 | Lindert et al. |
| 7,348,629 | B2 | 3/2008 | Chu et al. |
| 7,354,833 | B2 | 4/2008 | Liaw |
| 7,380,225 | B2 | 5/2008 | Joshi et al. |
| 7,398,497 | B2 | 7/2008 | Sato et al. |
| 7,402,207 | B1 | 7/2008 | Besser et al. |
| 7,402,872 | B2 | 7/2008 | Murthy et al. |
| 7,416,605 | B2 | 8/2008 | Zollner et al. |
| 7,427,788 | B2 | 9/2008 | Li et al. |
| 7,442,971 | B2 | 10/2008 | Wirbeleit et al. |
| 7,449,733 | B2 | 11/2008 | Inaba et al. |
| 7,462,908 | B2 | 12/2008 | Bol et al. |
| 7,469,164 | B2 | 12/2008 | Du-Nour |
| 7,470,593 | B2 | 12/2008 | Rouh et al. |
| 7,485,536 | B2 | 2/2009 | Jin et al. |
| 7,487,474 | B2 | 2/2009 | Ciplickas et al. |
| 7,491,988 | B2 | 2/2009 | Tolchinsky et al. |
| 7,494,861 | B2 | 2/2009 | Chu et al. |
| 7,496,862 | B2 | 2/2009 | Chang et al. |
| 7,496,867 | B2 | 2/2009 | Turner et al. |
| 7,498,637 | B2 | 3/2009 | Yamaoka et al. |
| 7,501,324 | B2 | 3/2009 | Babcock et al. |
| 7,503,020 | B2 | 3/2009 | Allen et al. |
| 7,507,999 | B2 | 3/2009 | Kusumoto et al. |
| 7,514,766 | B2 | 4/2009 | Yoshida |
| 7,521,323 | B2 | 4/2009 | Surdeanu et al. |
| 7,531,393 | B2 | 5/2009 | Doyle et al. |
| 7,531,836 | B2 | 5/2009 | Liu et al. |
| 7,538,364 | B2 | 5/2009 | Twynam |
| 7,538,412 | B2 | 5/2009 | Schulze et al. |
| 7,562,233 | B1 | 7/2009 | Sheng et al. |
| 7,564,105 | B2 | 7/2009 | Chi et al. |
| 7,566,600 | B2 | 7/2009 | Mouli |
| 7,569,456 | B2 | 8/2009 | Ko et al. |
| 7,586,322 | B1 | 9/2009 | Xu et al. |
| 7,592,241 | B2 | 9/2009 | Takao |
| 7,595,243 | B1 | 9/2009 | Bulucea et al. |
| 7,598,142 | B2 | 10/2009 | Ranade et al. |
| 7,605,041 | B2 | 10/2009 | Ema et al. |
| 7,605,060 | B2 | 10/2009 | Meunier-Beillard et al. |
| 7,605,429 | B2 | 10/2009 | Bertsein et al. |
| 7,608,496 | B2 | 10/2009 | Chu |
| 7,615,802 | B2 | 11/2009 | Elpelt et al. |
| 7,622,341 | B2 | 11/2009 | Chudzik et al. |
| 7,638,380 | B2 | 12/2009 | Pearce |
| 7,642,140 | B2 | 1/2010 | Bae et al. |
| 7,644,377 | B1 | 1/2010 | Saxe et al. |
| 7,645,665 | B2 | 1/2010 | Kubo et al. |
| 7,651,920 | B2 | 1/2010 | Siprak |
| 7,655,523 | B2 | 2/2010 | Babcock et al. |
| 7,673,273 | B2 | 3/2010 | Madurawe et al. |
| 7,675,126 | B2 | 3/2010 | Cho |
| 7,675,317 | B2 | 3/2010 | Perisetty |
| 7,678,638 | B2 | 3/2010 | Chu et al. |
| 7,681,628 | B2 | 3/2010 | Joshi et al. |
| 7,682,887 | B2 | 3/2010 | Dokumaci et al. |
| 7,683,442 | B1 | 3/2010 | Burr et al. |
| 7,696,000 | B2 | 4/2010 | Liu et al. |
| 7,704,822 | B2 | 4/2010 | Jeong |
| 7,704,844 | B2 | 4/2010 | Zhu et al. |
| 7,709,828 | B2 | 5/2010 | Braithwaite et al. |
| 7,723,750 | B2 | 5/2010 | Zhu et al. |
| 7,737,472 | B2 | 6/2010 | Kondo et al. |
| 7,741,138 | B2 | 6/2010 | Cho |
| 7,741,200 | B2 | 6/2010 | Cho et al. |
| 7,745,270 | B2 | 6/2010 | Shah et al. |
| 7,750,374 | B2 | 7/2010 | Capasso et al. |
| 7,750,381 | B2 | 7/2010 | Hokazono et al. |
| 7,750,405 | B2 | 7/2010 | Nowak |
| 7,750,682 | B2 | 7/2010 | Bernstein et al. |
| 7,755,144 | B2 | 7/2010 | Li et al. |
| 7,755,146 | B2 | 7/2010 | Helm et al. |
| 7,759,206 | B2 | 7/2010 | Luo et al. |
| 7,759,714 | B2 | 7/2010 | Itoh et al. |
| 7,761,820 | B2 | 7/2010 | Berger et al. |
| 7,795,677 | B2 | 9/2010 | Bangsaruntip et al. |
| 7,808,045 | B2 | 10/2010 | Kawahara et al. |
| 7,808,410 | B2 | 10/2010 | Kim et al. |
| 7,811,873 | B2 | 10/2010 | Mochizuki |
| 7,811,881 | B2 | 10/2010 | Cheng et al. |
| 7,818,702 | B2 | 10/2010 | Mandelman et al. |
| 7,821,066 | B2 | 10/2010 | Lebby et al. |
| 7,829,402 | B2 | 11/2010 | Matocha et al. |
| 7,831,873 | B1 | 11/2010 | Trimberger et al. |
| 7,846,822 | B2 | 12/2010 | Seebauer et al. |
| 7,855,118 | B2 | 12/2010 | Hoentschel et al. |

| | | | | | |
|---|---|---|---|---|---|
| 7,859,013 B2 | 12/2010 | Chen et al. | 8,258,026 B2 | 9/2012 | Bulucea |
| 7,863,163 B2 | 1/2011 | Bauer | 8,266,567 B2 | 9/2012 | El Yahyaoui et al. |
| 7,867,835 B2 | 1/2011 | Lee et al. | 8,286,180 B2 | 10/2012 | Foo |
| 7,883,977 B2 | 2/2011 | Babcock et al. | 8,288,798 B2 | 10/2012 | Passlack |
| 7,888,205 B2 | 2/2011 | Herner et al. | 8,299,562 B2 | 10/2012 | Li et al. |
| 7,888,747 B2 | 2/2011 | Hokazono | 8,324,059 B2 | 12/2012 | Guo et al. |
| 7,895,546 B2 | 2/2011 | Lahner et al. | 2001/0014495 A1 | 8/2001 | Yu |
| 7,897,495 B2 | 3/2011 | Ye et al. | 2002/0033511 A1 | 3/2002 | Babcock et al. |
| 7,906,413 B2 | 3/2011 | Cardone et al. | 2002/0042184 A1 | 4/2002 | Nandakumar et al. |
| 7,906,813 B2 | 3/2011 | Kato | 2003/0006415 A1 | 1/2003 | Yokogawa et al. |
| 7,910,419 B2 | 3/2011 | Fenouillet-Beranger et al. | 2003/0047763 A1 | 3/2003 | Hieda et al. |
| 7,919,791 B2 | 4/2011 | Flynn et al. | 2003/0122203 A1 | 7/2003 | Nishinohara |
| 7,926,018 B2 | 4/2011 | Moroz et al. | 2003/0173626 A1 | 9/2003 | Burr |
| 7,935,984 B2 | 5/2011 | Nakano | 2003/0183856 A1 | 10/2003 | Wieczorek |
| 7,941,776 B2 | 5/2011 | Majumder et al. | 2003/0215992 A1 | 11/2003 | Sohn et al. |
| 7,945,800 B2 | 5/2011 | Gomm et al. | 2004/0053457 A1 | 3/2004 | Sohn |
| 7,948,008 B2 | 5/2011 | Liu et al. | 2004/0075118 A1 | 4/2004 | Heinemann et al. |
| 7,952,147 B2 | 5/2011 | Ueno et al. | 2004/0075143 A1 | 4/2004 | Bae et al. |
| 7,960,232 B2 | 6/2011 | King et al. | 2004/0084731 A1 | 5/2004 | Matsuda et al. |
| 7,960,238 B2 | 6/2011 | Kohli et al. | 2004/0087090 A1 | 5/2004 | Grudowski et al. |
| 7,968,400 B2 | 6/2011 | Cai | 2004/0126947 A1 | 7/2004 | Sohn |
| 7,968,411 B2 | 6/2011 | Williford | 2004/0175893 A1 | 9/2004 | Vatus et al. |
| 7,968,440 B2 | 6/2011 | Seebauer | 2004/0180488 A1 | 9/2004 | Lee |
| 7,968,459 B2 | 6/2011 | Bedell et al. | 2005/0056877 A1 | 3/2005 | Rueckes et al. ............... 257/300 |
| 7,989,900 B2 | 8/2011 | Haensch et al. | 2005/0106824 A1 | 5/2005 | Alberto et al. |
| 7,994,573 B2 | 8/2011 | Pan | 2005/0116282 A1 | 6/2005 | Pattanayak et al. |
| 8,004,024 B2 | 8/2011 | Furukawa et al. | 2005/0250289 A1 | 11/2005 | Babcock et al. |
| 8,012,827 B2 | 9/2011 | Yu et al. | 2005/0280075 A1 | 12/2005 | Ema et al. |
| 8,029,620 B2 | 10/2011 | Kim et al. | 2006/0017100 A1 | 1/2006 | Bol et al. ...................... 257/331 |
| 8,039,332 B2 | 10/2011 | Bernard et al. | 2006/0022270 A1 | 2/2006 | Boyd et al. |
| 8,046,598 B2 | 10/2011 | Lee | 2006/0049464 A1 | 3/2006 | Rao |
| 8,048,791 B2 | 11/2011 | Hargrove et al. | 2006/0068555 A1 | 3/2006 | Huilong et al. |
| 8,048,810 B2 | 11/2011 | Tsai et al. | 2006/0068586 A1 | 3/2006 | Pain |
| 8,051,340 B2 | 11/2011 | Cranford, Jr. et al. | 2006/0071274 A1 | 4/2006 | Takao |
| 8,053,340 B2 | 11/2011 | Colombeau et al. | 2006/0091481 A1 | 5/2006 | Li et al. ........................ 257/401 |
| 8,063,466 B2 | 11/2011 | Kurita | 2006/0154428 A1 | 7/2006 | Dokumaci |
| 8,067,279 B2 | 11/2011 | Sadra et al. | 2006/0157794 A1 | 7/2006 | Doyle et al. .................. 257/368 |
| 8,067,280 B2 | 11/2011 | Wang et al. | 2006/0197158 A1 | 9/2006 | Babcock et al. |
| 8,067,302 B2 | 11/2011 | Li | 2006/0203581 A1 | 9/2006 | Joshi et al. |
| 8,076,719 B2 | 12/2011 | Zeng et al. | 2006/0220114 A1 | 10/2006 | Miyashita et al. |
| 8,097,529 B2 | 1/2012 | Krull et al. | 2006/0223248 A1 | 10/2006 | Venugopal et al. |
| 8,103,983 B2 | 1/2012 | Agarwal et al. | 2007/0040222 A1 | 2/2007 | Van Camp et al. |
| 8,105,891 B2 | 1/2012 | Yeh et al. | 2007/0117326 A1 | 5/2007 | Tan et al. |
| 8,106,424 B2 | 1/2012 | Schruefer | 2007/0158790 A1 | 7/2007 | Rao |
| 8,106,481 B2 | 1/2012 | Rao | 2007/0212861 A1 | 9/2007 | Chidambarrao et al. |
| 8,110,487 B2 | 2/2012 | Griebenow et al. | 2007/0238253 A1 | 10/2007 | Tucker |
| 8,114,761 B2 | 2/2012 | Mandrekar et al. | 2008/0067589 A1 | 3/2008 | Ito et al. |
| 8,119,482 B2 | 2/2012 | Bhalla et al. | 2008/0108208 A1 | 5/2008 | Arevalo et al. |
| 8,120,069 B2 | 2/2012 | Hynecek | 2008/0138953 A1 | 6/2008 | Challa et al. ................. 438/270 |
| 8,129,246 B2 | 3/2012 | Babcock et al. | 2008/0169493 A1 | 7/2008 | Lee et al. |
| 8,129,797 B2 | 3/2012 | Chen et al. | 2008/0169516 A1 | 7/2008 | Chung |
| 8,134,159 B2 | 3/2012 | Hokazono | 2008/0197439 A1 | 8/2008 | Goerlach et al. |
| 8,143,120 B2 | 3/2012 | Kerr et al. | 2008/0227250 A1 | 9/2008 | Ranade et al. |
| 8,143,124 B2 | 3/2012 | Challa et al. | 2008/0237661 A1 | 10/2008 | Ranade et al. |
| 8,143,678 B2 | 3/2012 | Kim et al. | 2008/0258198 A1 | 10/2008 | Bojarczuk et al. |
| 8,148,774 B2 | 4/2012 | Mori et al. | 2008/0272409 A1 | 11/2008 | Sonkusale et al. |
| 8,163,619 B2 | 4/2012 | Yang et al. | 2009/0003105 A1 | 1/2009 | Itoh et al. ...................... 365/203 |
| 8,169,002 B2 | 5/2012 | Chang et al. | 2009/0057746 A1 | 3/2009 | Sugll et al. |
| 8,170,857 B2 | 5/2012 | Joshi et al. | 2009/0057762 A1 | 3/2009 | Bangsaruntip et al. ........ 257/347 |
| 8,173,499 B2 | 5/2012 | Chung et al. | 2009/0108350 A1 | 4/2009 | Cai et al. |
| 8,173,502 B2 | 5/2012 | Yan et al. | 2009/0121298 A1 | 5/2009 | Furukawa et al. ............. 257/412 |
| 8,176,461 B1 | 5/2012 | Trimberger | 2009/0134468 A1 | 5/2009 | Tsuchiya et al. |
| 8,178,430 B2 | 5/2012 | Kim et al. | 2009/0224319 A1 | 9/2009 | Kohli |
| 8,179,530 B2 | 5/2012 | Levy et al. | 2009/0302388 A1 | 12/2009 | Cai et al. |
| 8,183,096 B2 | 5/2012 | Wirbeleit | 2009/0309140 A1 | 12/2009 | Khamankar et al. |
| 8,183,107 B2 | 5/2012 | Mathur et al. | 2009/0311837 A1 | 12/2009 | Kapoor |
| 8,185,865 B2 | 5/2012 | Gupta et al. | 2009/0321849 A1 | 12/2009 | Miyamura et al. |
| 8,187,959 B2 | 5/2012 | Pawlak et al. | 2010/0012988 A1 | 1/2010 | Yang et al. |
| 8,188,542 B2 | 5/2012 | Yoo et al. | 2010/0038724 A1 | 2/2010 | Anderson et al. |
| 8,196,545 B2 | 6/2012 | Kurosawa | 2010/0100856 A1 | 4/2010 | Mittal |
| 8,201,122 B2 | 6/2012 | Dewey, III et al. | 2010/0148153 A1 | 6/2010 | Hudait et al. |
| 8,214,190 B2 | 7/2012 | Joshi et al. | 2010/0149854 A1 | 6/2010 | Vora |
| 8,217,423 B2 | 7/2012 | Liu et al. | 2010/0187641 A1 | 7/2010 | Zhu et al. |
| 8,225,255 B2 | 7/2012 | Ouyang et al. | 2010/0207182 A1 | 8/2010 | Paschal |
| 8,227,307 B2 | 7/2012 | Chen et al. | 2010/0270600 A1 | 10/2010 | Inukai et al. |
| 8,236,661 B2 | 8/2012 | Dennard et al. | 2011/0059588 A1* | 3/2011 | Kang ........................... 438/291 |
| 8,239,803 B2 | 8/2012 | Kobayashi | 2011/0073961 A1 | 3/2011 | Dennard et al. |
| 8,247,300 B2 | 8/2012 | Babcock et al. | 2011/0074498 A1 | 3/2011 | Thompson et al. |
| 8,255,843 B2 | 8/2012 | Chen et al. | 2011/0079860 A1 | 4/2011 | Verhulst |

| | | | |
|---|---|---|---|
| 2011/0079861 | A1 | 4/2011 | Shifren et al. |
| 2011/0095811 | A1 | 4/2011 | Chi et al. |
| 2011/0147828 | A1 | 6/2011 | Murthy et al. |
| 2011/0169082 | A1 | 7/2011 | Zhu et al. |
| 2011/0175170 | A1 | 7/2011 | Wang et al. |
| 2011/0180880 | A1 | 7/2011 | Chudzik et al. |
| 2011/0193164 | A1 | 8/2011 | Zhu |
| 2011/0212590 | A1 | 9/2011 | Wu et al. |
| 2011/0230039 | A1 | 9/2011 | Mowry et al. |
| 2011/0242921 | A1 | 10/2011 | Tran et al. |
| 2011/0248352 | A1 | 10/2011 | Shifren |
| 2011/0294278 | A1 | 12/2011 | Eguchi et al. |
| 2011/0309447 | A1 | 12/2011 | Arghavani et al. |
| 2012/0021594 | A1 | 1/2012 | Gurtej et al. |
| 2012/0034745 | A1 | 2/2012 | Colombeau et al. |
| 2012/0056275 | A1 | 3/2012 | Cai et al. |
| 2012/0065920 | A1 | 3/2012 | Nagumo et al. |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |

FOREIGN PATENT DOCUMENTS

| | | | |
|---|---|---|---|
| EP | 0531621 | | 3/1993 |
| EP | 0683 515 | | 11/1995 |
| EP | 0889502 | | 1/1999 |
| EP | 1 450 394 | A1 | 8/2004 |
| JP | 59193066 | | 11/1984 |
| JP | 4186774 | | 7/1992 |
| JP | 8153873 | | 6/1996 |
| JP | 8288508 | | 11/1996 |
| JP | 2004087671 | | 3/2004 |
| KR | 794094 | * | 1/2008 |
| WO | WO2011/062788 | | 5/2011 |

OTHER PUBLICATIONS

*PCT Notification of Transmittal of the International Search Report and the Written Opinion of the International Searching Authority* for International Application No. PCT/US2011/041156; dated Sep. 21, 2011; 12 pages.

Yan, et al., "Scaling the Si MOSFET: From Bulk to SOI to Bulk", IEEE Transactions on Electron Devices, IEEE Service Center, Pisacataway, NJ, US, vol. 39, No. 7, Jul. 1, 1992 pp. 1704-1710.

*PCT Notification of Transmittal of the International Search Report and the Written Opinion of the International Searching Authority* for International Application No. PCT/US2011/041165; dated Nov. 2, 2011; 6 pages.

*PCT Notification of Transmittal of the International Search Report and the Written Opinion of the International Searching Authority* for International Application No. PCT/US10/48998; 10 pages, Jan. 6, 2011.

*PCT Notification of Transmittal of the International Search Report and the Written Opinion of the International Searching Authority* for International Application No. PCT/US2010/049000; 9 pages, Jan. 12, 2011.

Shao, et al. "Boron diffusion in silicon: the anomalies and control by point defect engineering" Materials Science and Engineering R: Reports, vol. 42, No. 3-4, Nov. 1, 2003 pp. 65-114.

*USPTO Office Action* for U.S. Appl. No. 12/895,695, filed Sep. 30, 2010 in the name of Lucian Shifren, et al. 27 pages, dated May 27, 2011.

*USPTO Office Action* for U.S. Appl. No. 12/895,695, filed Sep. 30, 2010 in the name of Lucian Shifren, et al. 30 pages, dated Oct. 24, 2011.

Robertson, LS et al., "The Effect of Impurities on Diffusion and Activation of Ion Implanted Boron in Silicon", Mat. Res. Soc. Symp. vol. 610, 2000.

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Abiko, H et al., "A Channel Engineering Combined with Channel Epitaxy Optimization and TED Suppression for 0.15 μm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961. 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

US 7,011,991, 03/2006, Li (withdrawn).

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero- Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003.

Sheu, et al. "Modeling the Well-Edge Proximity Effect in Highly Scaled MOSFETs", IEEE Transactions on Electron Devices, vol. 53, No. 11, pps. 2792-2798, Nov. 2006.

\* cited by examiner

US 8,421,162 B2

ADVANCED TRANSISTORS WITH PUNCH THROUGH SUPPRESSION

RELATED APPLICATIONS

This application claims the benefit of U.S. Provisional Application No. 61/247,300, filed Sep. 30, 2009, the disclosure of which is incorporated by reference herein. This application also claims the benefit of U.S. Provisional Application No. 61/262,122, filed Nov. 17, 2009, the disclosure of which is incorporated by reference herein, and U.S. patent application Ser. No. 12/708,497, titled "Electronic Devices and Systems, and Methods for Making and Using the Same", filed Feb. 18, 2010, the disclosure of which is incorporated by reference herein. This application also claims the benefit of U.S. Provisional Application No. 61/357,492, filed Jun. 22, 2010, the disclosure of which is incorporated by reference herein.

FIELD OF THE INVENTION

This disclosure relates to structures and processes for forming advanced transistors with improved operational characteristics, including enhanced punch through suppression.

BACKGROUND OF THE INVENTION

Fitting more transistors onto a single die is desirable to reduce cost of electronics and improve their functional capability. A common strategy employed by semiconductor manufacturers is to simply reduce gate size of a field effect transistor (FET), and proportionally shrink area of the transistor source, drain, and required interconnects between transistors. However, a simple proportional shrink is not always possible because of what are known as "short channel effects". Short channel effects are particularly acute when channel length under a transistor gate is comparable in magnitude to depletion depth of an operating transistor, and include reduction in threshold voltage, severe surface scattering, drain induced barrier lowering (DIBL), source-drain punch through, and electron mobility issues.

Conventional solutions to mitigate some short channel effects can involve implantation of pocket or halo implants around the source and the drain. Halo implants can be symmetrical or asymmetrical with respect to a transistor source and drain, and typically provide a smoother dopant gradient between a transistor well and the source and drains. Unfortunately, while such implants improve some electrical characteristics such as threshold voltage rolloff and drain induced barrier lowering, the resultant increased channel doping adversely affects electron mobility, primarily because of the increased dopant scattering in the channel.

Many semiconductor manufacturers have attempted to reduce short channel effects by employing new transistor types, including fully or partially depleted silicon on insulator (SOI) transistors. SOI transistors are built on a thin layer of silicon that overlies an insulator layer, have an undoped or low doped channel that minimizes short channel effects, and do not require either deep well implants or halo implants for operation. Unfortunately, creating a suitable insulator layer is expensive and difficult to accomplish. Early SOI devices were built on insulative sapphire wafers instead of silicon wafers, and are typically only used in specialty applications (e.g. military avionics or satellite) because of the high costs. Modern SOI technology can use silicon wafers, but require require expensive and time consuming additional wafer processing steps to make an insulative silicon oxide layer that extends across the entire wafer below a surface layer of device-quality single-crystal silicon.

One common approach to making such a silicon oxide layer on a silicon wafer requires high dose ion implantation of oxygen and high temperature annealing to form a buried oxide (BOX) layer in a bulk silicon wafer. Alternatively, SOI wafers can be fabricated by bonding a silicon wafer to another silicon wafer (a "handle" wafer) that has an oxide layer on its surface. The pair of wafers are split apart, using a process that leaves a thin transistor quality layer of single crystal silicon on top of the BOX layer on the handle wafer. This is called the "layer transfer" technique, because it transfers a thin layer of silicon onto a thermally grown oxide layer of the handle wafer.

As would be expected, both BOX formation or layer transfer are costly manufacturing techniques with a relatively high failure rate. Accordingly, manufacture of SOI transistors not an economically attractive solution for many leading manufacturers. When cost of transistor redesign to cope with "floating body" effects, the need to develop new SOI specific transistor processes, and other circuit changes is added to SOI wafer costs, it is clear that other solutions are needed.

Another possible advanced transistor that has been investigated uses multiple gate transistors that, like SOI transistors, minimize short channel effects by having little or no doping in the channel. Commonly known as a finFET (due to a fin-like shaped channel partially surrounded by gates), use of finFET transistors has been proposed for transistors having 28 nanometer or lower transistor gate size. But again, like SOI transistors, while moving to a radically new transistor architecture solves some short channel effect issues, it creates others, requiring even more significant transistor layout redesign than SOI. Considering the likely need for complex non-planar transistor manufacturing techniques to make a finFET, and the unknown difficulty in creating a new process flow for finFET, manufacturers have been reluctant to invest in semiconductor fabrication facilities capable of making finFETs.

DETAILED DESCRIPTION

Unlike silicon on insulator (SOI) transistors, nanoscale bulk CMOS transistors (those typically having a gate length less than 100 nanometers) are subject to significant adverse short channel effects, including body leakage through both drain induced barrier lowering (DIBL) and source drain punch through. Punch through is associated with the merging of source and drain depletion layers, causing the drain depletion layer to extend across a doped substrate and reach the source depletion layer, creating a conduction path or leakage current between the source and drain. This results in a substantial increase in required transistor electrical power, along with a consequent increase in transistor heat output and decrease in operational lifetime for portable or battery powered devices using such transistors.

Figure 1:
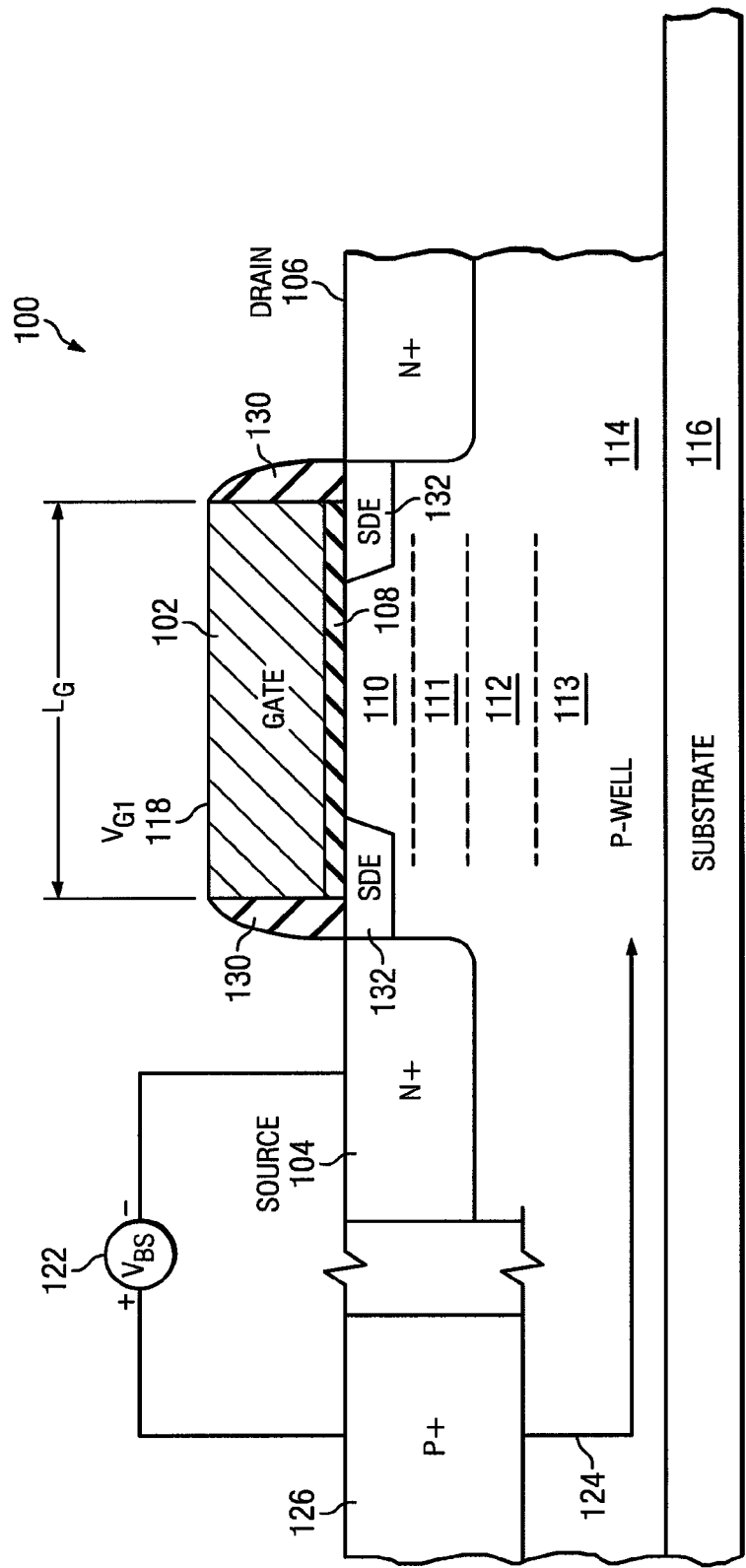
FIG. 1 illustrates a DDC transistor with a punch through suppression.

An improved transistor manufacturable on bulk CMOS substrates is seen in FIG. 1. A Field Effect Transistor (FET) 100 is configured to have greatly reduced short channel effects, along with enhanced punch through suppression according to certain described embodiments. The FET 100 includes a gate electrode 102, source 104, drain 106, and a gate dielectric 108 positioned over a channel 110. In operation, the channel 110 is deeply depleted, forming what can be described as deeply depleted channel (DDC) as compared to conventional transistors, with depletion depth set in part by a highly doped screening region 112. While the channel 110 is substantially undoped, and positioned as illustrated above a highly doped screening region 112, it may include simple or complex layering with different dopant concentrations. This doped layering can include a threshold voltage set region 111 with a dopant concentration less than screening region 112, optionally positioned between the gate dielectric 108 and the screening region 112 in the channel 110. A threshold voltage set region 111 permits small adjustments in operational threshold voltage of the FET 100, while leaving the bulk of the channel 110 substantially undoped. In particular, that portion of the channel 110 adjacent to the gate dielectric 108 should remain undoped. Additionally, a punch through suppression region 113 is formed beneath the screening region 112. Like the threshold voltage set region 111, the punch through suppression region 113 has a dopant concentration less than screening region 112, while being higher than the overall dopant concentration of a lightly doped well substrate 114.

In operation, a bias voltage 122 $V_{BS}$ may be applied to source 104 to further modify operational threshold voltage, and P+ terminal 126 can be connected to P-well 114 at connection 124 to close the circuit. The gate stack includes a gate electrode 102, gate contact 118 and a gate dielectric 108. Gate spacers 130 are included to separate the gate from the source and drain, and optional Source/Drain Extensions (SDE) 132, or "tips" extend the source and drain under the gate spacers and gate dielectric 108, somewhat reducing the gate length and improving electrical characteristics of FET 100.

In this exemplary embodiment, the FET 100 is shown as an N-channel transistor having a source and drain made of N-type dopant material, formed upon a substrate as P-type doped silicon substrate providing a P-well 114 formed on a substrate 116. However, it will be understood that, with appropriate change to substrate or dopant material, a non-silicon P-type semiconductor transistor formed from other suitable substrates such as Gallium Arsenide based materials may be substituted. The source 104 and drain 106 can be formed using conventional dopant implant processes and materials, and may include, for example, modifications such as stress inducing source/drain structures, raised and/or recessed source/drains, asymmetrically doped, counter-doped or crystal structure modified source/drains, or implant doping of source/drain extension regions according to LDD (low doped drain) techniques. Various other techniques to modify source/drain operational characteristics can also be used, including, in certain embodiments, use of heterogeneous dopant materials as compensation dopants to modify electrical characteristics.

The gate electrode 102 can be formed from conventional materials, preferably including, but not limited to, metals, metal alloys, metal nitrides and metal silicides, as well as laminates thereof and composites thereof. In certain embodiments the gate electrode 102 may also be formed from poly-silicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 102 can include silicide methods, chemical vapor deposition methods and physical vapor deposition methods, such as, but not limited to, evaporative methods and sputtering methods. Typically, the gate electrode 102 has an overall thickness from about 1 to about 500 nanometers.

The gate dielectric 108 may include conventional dielectric materials such as oxides, nitrides and oxynitrides. Alternatively, the gate dielectric 108 may include generally higher dielectric constant dielectric materials including, but not limited to hafnium oxides, hafnium silicates, zirconium oxides, lanthanum oxides, titanium oxides, barium-strontium-titanates and lead-zirconate-titanates, metal based dielectric materials, and other materials having dielectric properties. Preferred hafnium-containing oxides include $HfO_2$, $HfZrO_x$, $HfSiO_x$, $HfTiO_x$, $HfAlO_x$, and the like. Depending on composition and available deposition processing equipment, the gate dielectric 108 may be formed by such methods as thermal or plasma oxidation, nitridation methods, chemical vapor deposition methods (including atomic layer deposition methods) and physical vapor deposition methods. In some embodiments, multiple or composite layers, laminates, and compositional mixtures of dielectric materials can be used. For example, a gate dielectric can be formed from a $SiO_2$-based insulator having a thickness between about 0.3 and 1 nm and the hafnium oxide based insulator having a thickness between 0.5 and 4 nm. Typically, the gate dielectric has an overall thickness from about 0.5 to about 5 nanometers.

The channel region 110 is formed below the gate dielectric 108 and above the highly doped screening region 112. The channel region 110 also contacts and extends between, the source 104 and the drain 106. Preferably, the channel region includes substantially undoped silicon having a dopant concentration less than $5 \times 10^{17}$ dopant atoms per $cm^3$ adjacent or near the gate dielectric 108. Channel thickness can typically range from 5 to 50 nanometers. In certain embodiments the channel region 110 is formed by epitaxial growth of pure or substantially pure silicon on the screening region.

As disclosed, the threshold voltage set region 111 is positioned under the gate dielectric 108, spaced therefrom, and above screening region 112, and is typically formed as a thin doped layer. Suitably varying dopant concentration, thickness, and separation from the gate dielectric and the screening region allows for controlled slight adjustments of threshold voltage in the operating FET 100. In certain embodiments, the threshold voltage set region 111 is doped to have a concentration between about $1 \times 10^{18}$ dopant atoms per $cm^3$ and about $1 \times 10^{19}$ dopant atoms per $cm^3$. The threshold voltage set region 111 can be formed by several different processes, including 1) in-situ epitaxial doping, 2) epitaxial growth of a thin layer of silicon followed by a tightly controlled dopant implant, 3) epitaxial growth of a thin layer of silicon followed by dopant diffusion of atoms from the screening region 112, or 4) by any combination of these processes (e.g. epitaxial growth of silicon followed by both dopant implant and diffusion from the screening layer 112).

Position of a highly doped screening region 112 typically sets depth of the depletion zone of an operating FET 100. Advantageously, the screening region 112 (and associated depletion depth) are set at a depth that ranges from one comparable to the gate length (Lg/1) to a depth that is a large fraction of the gate length (Lg/5). In preferred embodiments, the typical range is between Lg/3 to Lg/1.5. Devices having an Lg/2 or greater are preferred for extremely low power operation, while digital or analog devices operating at higher voltages can often be formed with a screening region between Lg/5 and Lg/2. For example, a transistor having a gate length of 32 nanometers could be formed to have a screening region that has a peak dopant density at a depth below the gate dielectric of about 16 nanometers (Lg/2), along with a threshold voltage set region at peak dopant density at a depth of 8 nanometers (Lg/4).

In certain embodiments, the screening region 112 is doped to have a concentration between about $5 \times 10^{18}$ dopant atoms per $cm^3$ and about $1 \times 10^{20}$ dopant atoms per $cm^3$, significantly more than the dopant concentration of the undoped channel, and at least slightly greater than the dopant concentration of the optional threshold voltage set region 111. As will be appreciated, exact dopant concentrations and screening region depths can be modified to improve desired operating characteristics of FET 100, or to take in to account available transistor manufacturing processes and process conditions.

To help control leakage, the punch through suppression region 113 is formed beneath the screening region 112. Typically, the punch through suppression region 113 is formed by direct implant into a lightly doped well, but it may be formed by out-diffusion from the screening region, in-situ growth, or other known process. Like the threshold voltage set region 111, the punch through suppression region 113 has a dopant concentration less than the screening region 112, typically set between about $1 \times 10^{18}$ dopant atoms per $cm^3$ and about $1 \times 10^{19}$ dopant atoms per $cm^3$. In addition, the punch through suppression region 113 dopant concentration is set higher than the overall dopant concentration of the well substrate. As will be appreciated, exact dopant concentrations and depths can be modified to improve desired operating characteristics of FET 100, or to take in to account available transistor manufacturing processes and process conditions.

Forming such a FET 100 is relatively simple compared to SOI or finFET transistors, since well developed and long used planar CMOS processing techniques can be readily adapted.

Together, the structures and the methods of making the structures allow for FET transistors having both a low operating voltage and a low threshold voltage as compared to conventional nanoscale devices. Furthermore, DDC transistors can be configured to allow for the threshold voltage to be statically set with the aid of a voltage body bias generator. In some embodiments the threshold voltage can even be dynamically controlled, allowing the transistor leakage currents to be greatly reduced (by setting the voltage bias to upwardly adjust the $V_T$ for low leakage, low speed operation), or increased (by downwardly adjusting the $V_T$ for high leakage, high speed operation). Ultimately, these structures and the methods of making structures provide for designing integrated circuits having FET devices that can be dynamically adjusted while the circuit is in operation. Thus, transistors in an integrated circuit can be designed with nominally identical structure, and can be controlled, modulated or programmed to operate at different operating voltages in response to different bias voltages, or to operate in different operating modes in response to different bias voltages and operating voltages. In addition, these can be configured post-fabrication for different applications within a circuit.

As will be appreciated, concentrations of atoms implanted or otherwise present in a substrate or crystalline layers of a semiconductor to modify physical and electrical characteristics of a semiconductor are be described in terms of physical and functional regions or layers. These may be understood by those skilled in the art as three-dimensional masses of material that have particular averages of concentrations. Or, they may be understood as sub-regions or sub-layers with different or spatially varying concentrations. They may also exist as small groups of dopant atoms, regions of substantially similar dopant atoms or the like, or other physical embodiments. Descriptions of the regions based on these properties are not intended to limit the shape, exact location or orientation. They are also not intended to limit these regions or layers to any particular type or number of process steps, type or numbers of layers (e.g., composite or unitary), semiconductor deposition, etch techniques, or growth techniques utilized. These processes may include epitaxially formed regions or atomic layer deposition, dopant implant methodologies or particular vertical or lateral dopant profiles, including linear, monotonically increasing, retrograde, or other suitable spatially varying dopant concentration. To ensure that desired dopant concentrations are maintained, various dopant anti-migration techniques, are contemplated, including low temperature processing, carbon doping, in-situ dopant deposition, and advanced flash or other annealing techniques. The resultant dopant profile may have one or more regions or layers with different dopant concentrations, and the variations in concentrations and how the regions or layers are defined, regardless of process, may or may not be detectable via techniques including infrared spectroscopy, Rutherford Back Scattering (RBS), Secondary Ion Mass Spectroscopy (SIMS), or other dopant analysis tools using different qualitative or quantitative dopant concentration determination methodologies.

Figure 2:
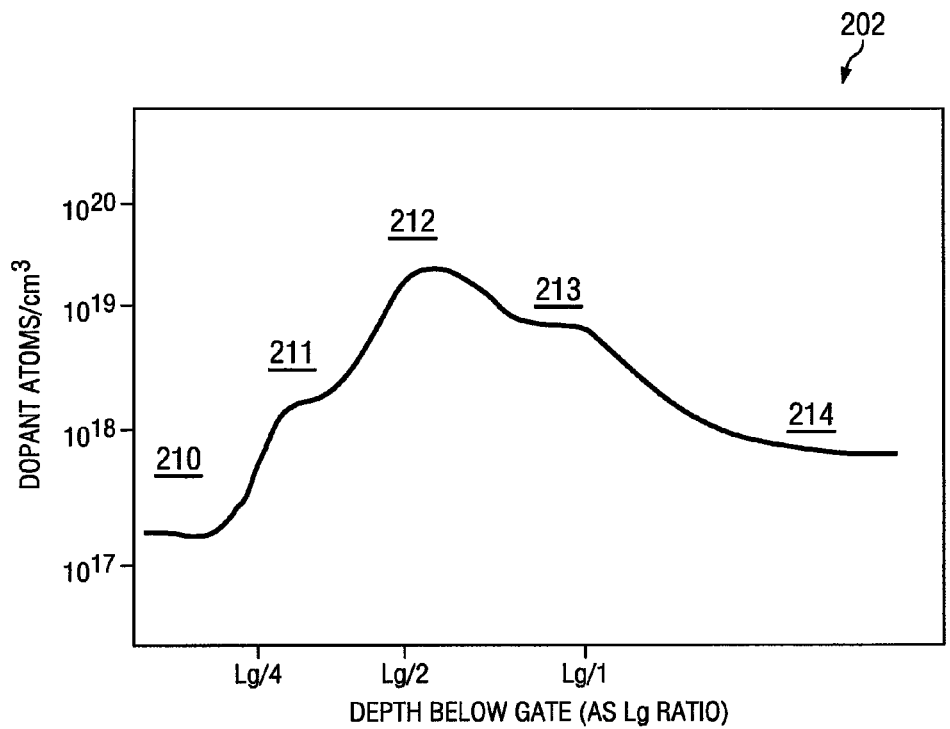
FIG. 2 illustrates a dopant profile of a DDC transistor with enhanced punch through suppression.

To better appreciate one possible transistor structure, FIG. 2 illustrates a dopant profile 202 of a deeply depleted transistor taken at midline between a source and drain, and extending downward from a gate dielectric toward a well. Concentration is measured in number of dopant atoms per cubic centimeter, and downward depth is measured as a ratio of gate length Lg. Measuring as a ratio rather than absolute depth in nanometers better allows cross comparison between transistors manufactured at different nodes (e.g 45 nm, 32 nm, 22 nm, or 15 nm) where nodes are commonly defined in term of minimum gate lengths.

As seen in FIG. 2, the region of the channel 210 adjacent to the gate dielectric is substantially free of dopants, having less than $5 \times 10^{17}$ dopant atoms per $cm^3$ to a depth of nearly Lg/4. A threshold voltage set region 211 increases the dopant concentration to about $3 \times 10^{18}$ dopant atoms per $cm^3$, and the concentration increases another order of magnitude to about $3 \times 10^{18}$ dopant atoms per $cm^3$ to form the screening region 212 that sets the base of the depletion zone in an operating transistor. A punch through suppression region 213 region having a dopant concentration of about $1 \times 10^{19}$ dopant atoms per $cm^3$ at a depth of about Lg/1 is intermediate between the screening region and the lightly doped well 214. Without the punch through suppression region, a transistor constructed to have, for example, a 30 nm gate length and an operating voltage of 1.0 volts would be expected to have significantly greater leakage. When the disclosed punch through suppression region is implanted, punch through leakage is reduced, making the transistor more power efficient, and better able to tolerate process variations in transistor structure without punch through failure.

This is better seen with respect to the following Table 1, which indicates expected performance improvements for a range of punch through dosage and threshold voltage:

TABLE 1

|  | Ioff (nA/um) | Idsat (mA/um) | Vt (V) |
|---|---|---|---|
| Target Punchthrough layer | 2 | 0.89 | 0.31 |
| No Punchthrough layer | 70 | 1 | 0.199 |
| Higher Dose Punchthrough | 0.9 | 0.54 | 0.488 |
| Very deep Punchthrough | 15 | 1 | 0.237 |

Figure 3:
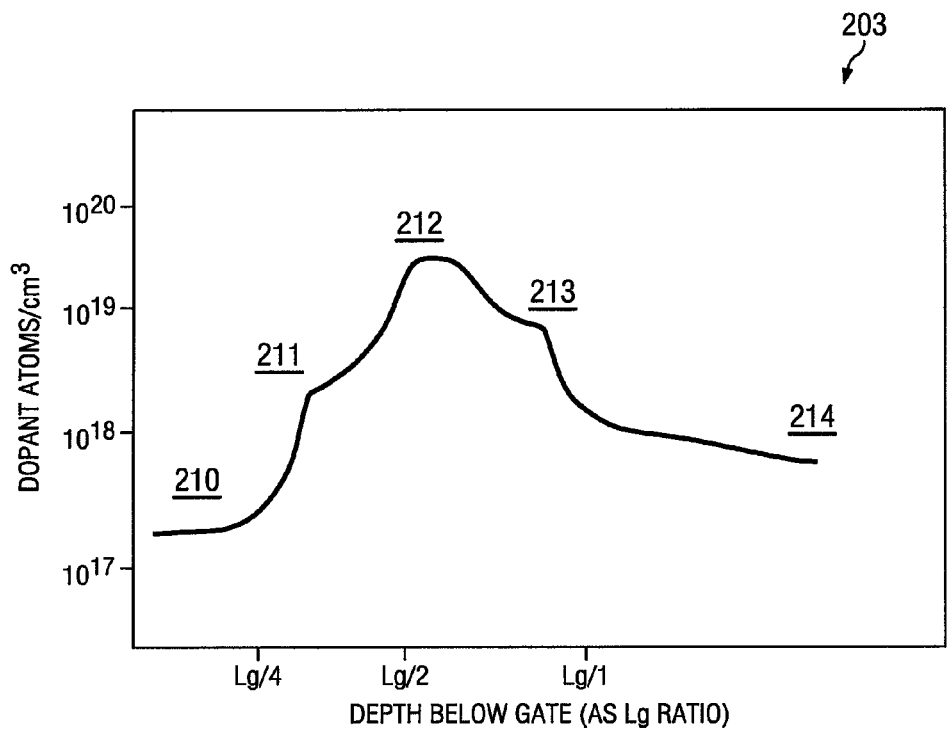
FIGS. 3-7 illustrate alternative useful dopant profiles.

Alternative dopant profiles are contemplated. As seen in FIG. 3, an alternative dopant profile 203 that includes a slightly increased depth for the low doped channel is shown. In contrast to the embodiments of FIG. 2, the threshold voltage set region 211 is a shallow notch primarily formed by out-diffusion into an epitaxially deposited layer of silicon from the screening region 212. The screening region 212 itself is set to have a dopant concentration greater than $3\times10^{19}$ dopant atoms per $cm^3$. The punch through suppression region 213 has a dopant concentration of about $8\times10^{18}$ dopant atoms per $cm^3$, provided by a combination of out-diffusion from the screening region 212 and a separate low energy implant.

Figure 4:
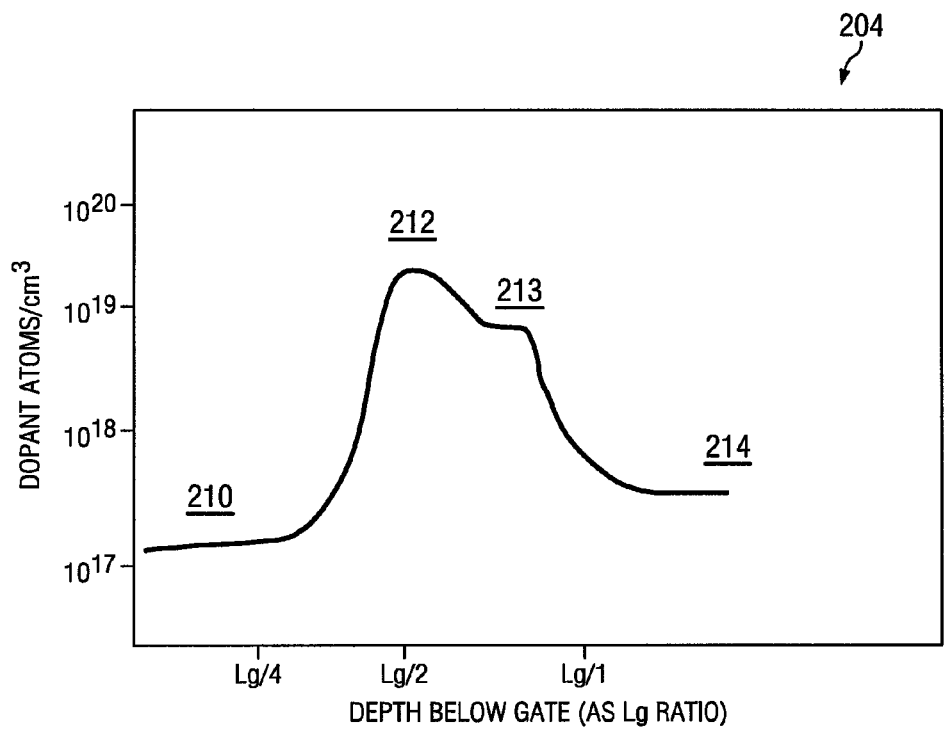

As seen in FIG. 4, an alternative dopant profile 204 that includes a greatly increased depth for the low doped channel is shown. In contrast to the embodiments of FIGS. 2 and 3, there is no distinct notch, plane or layer to aid in threshold voltage setting. The screening region 212 is set to be greater than $3\times10^{19}$ dopant atoms per $cm^3$ and the punch through suppression region 213 has a similarly high, yet narrowly defined dopant concentration of about $8\times10^{18}$ dopant atoms per $cm^3$, provided by a separate low energy implant.

Figure 5:
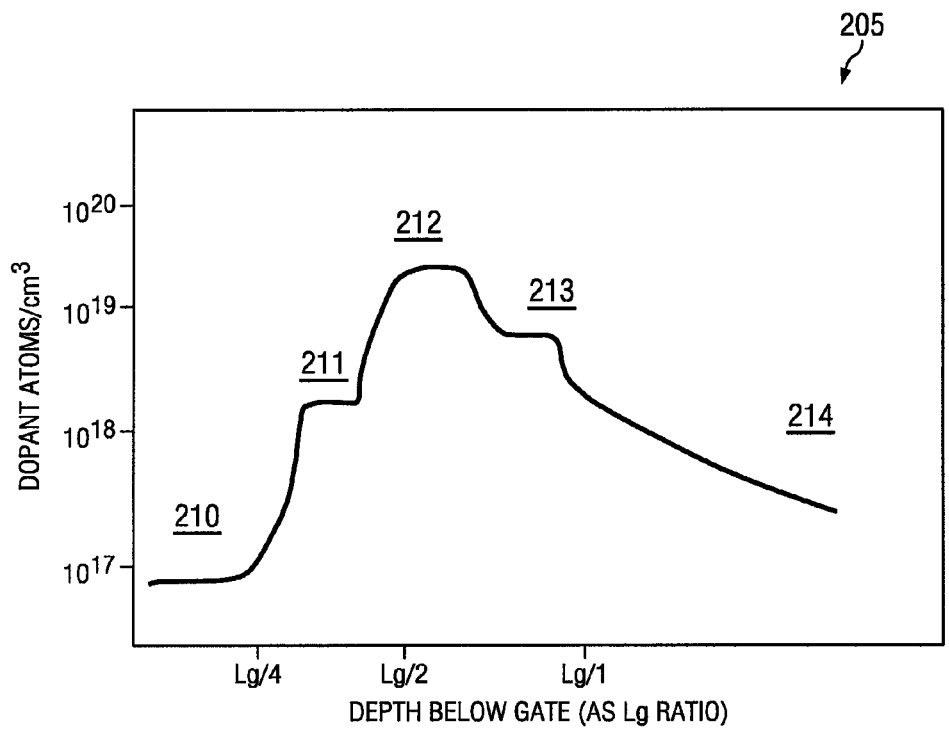

Yet another variation in dopant profile is seen in FIG. 5, which illustrates a transistor dopant profile 205 for a transistor structure that includes a very low doped channel 210. The threshold voltage set region 211 is precisely formed by in-situ or well controlled implant doping of thin epitaxial layer grown on the screening region. The screening region 212 is set to be about $1\times10^{19}$ dopant atoms per $cm^3$ and the punch through suppression region 213 also has narrowly defined dopant concentration of about $8\times10^{18}$ dopant atoms per $cm^3$, provided by with a separate low energy implant. The well implant 214 concentration is gradually reduced to about $5\times10^{17}$ dopant atoms per $cm^3$.

Figure 6:
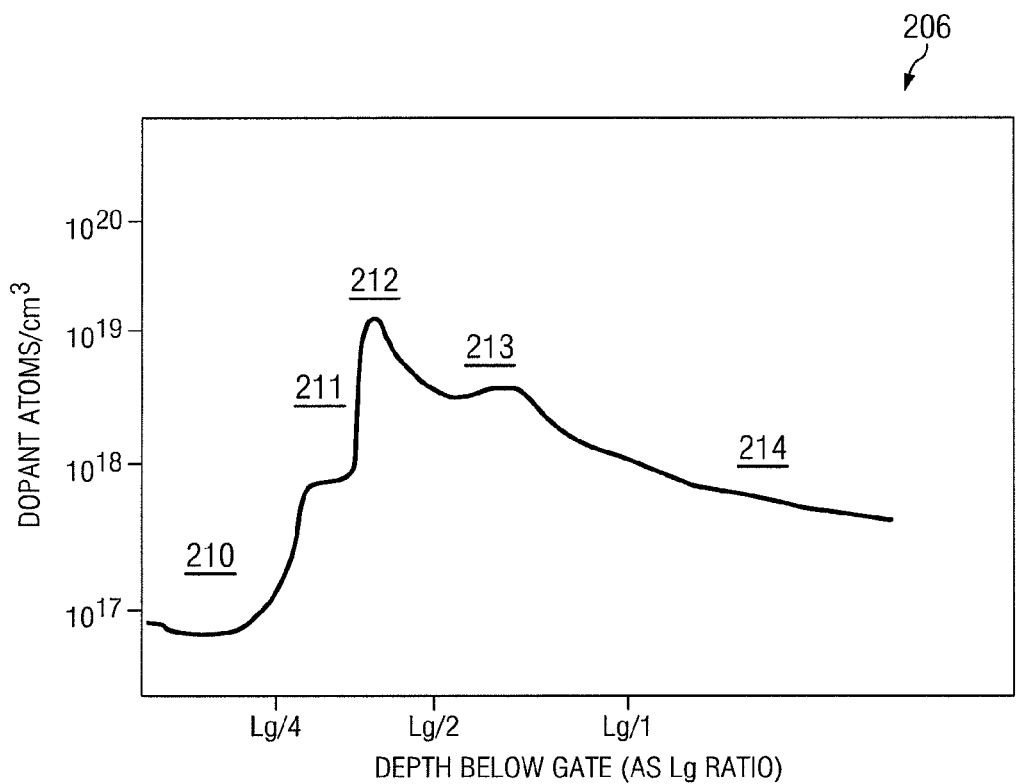

As seen in FIG. 6, a dopant profile 206 includes a low doped channel 210 adjacent to the gate dielectric, and a narrowly defined threshold voltage set region 211. The screening region 212 increases to a narrow peak set to be about $1\times10^{19}$ dopant atoms per $cm^3$ and the punch through suppression region 213 also has broadly peak dopant concentration of about $5\times10^{18}$ dopant atoms per $cm^3$, provided by with a separate low energy implant. The well implant 214 concentration is high to improve bias coefficient of the transistor, with a concentration of about $8\times10^{17}$ dopant atoms per $cm^3$.

Figure 7:
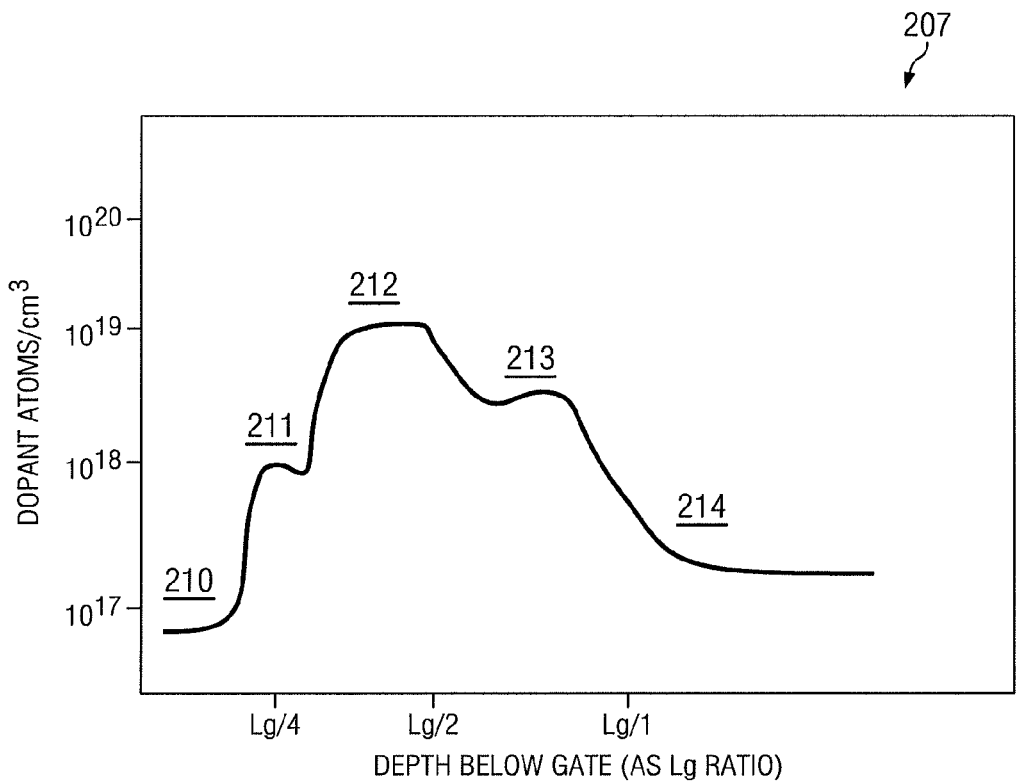

In contrast to the narrow screen region peak dopant concentration of FIG. 6, the dopant profile 207 of FIG. 7 has a broad peak 212. In addition to a narrow undoped channel 210, the transistor structure includes a well defined partially retrograde threshold set 211, and a distinct separate punch through suppression peak 213. The well 214 doping concentration is relatively low, less than about $5\times10^{17}$ dopant atoms per $cm^3$.

Figure 8:
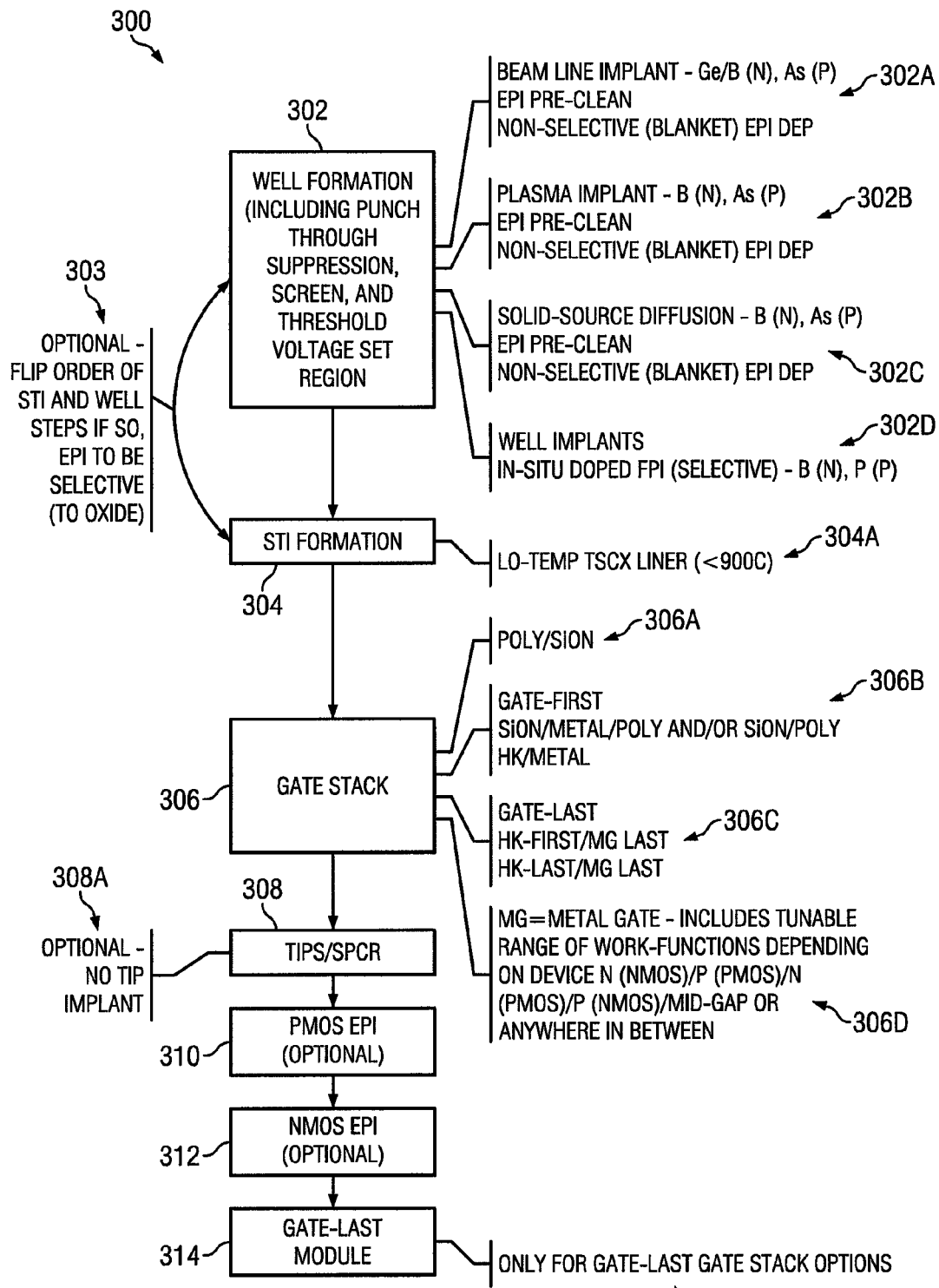
FIG. 8 is a flow diagram illustrating one exemplary process for forming a DDC transistor with a punch through suppression.

FIG. 8 is a schematic process flow diagram 300 illustrating one exemplary process for forming a transistor with a punch through suppression region and a screening region suitable for different types of FET structures, including both analog and digital transistors. The process illustrated here is intended to be general and broad in its description in order not to obscure the inventive concepts, and more detailed embodiments and examples are set forth below. These along with other process steps allow for the processing and manufacture of integrated circuits that include DDC structured devices together with legacy devices, allowing for designs to cover a full range of analog and digital devices with improved performance and lower power.

In Step 302, the process begins at the well formation, which may be one of many different processes according to different embodiments and examples. As indicated in 303, the well formation may be before or after STI (shallow trench isolation) formation 304, depending on the application and results desired. Boron (B), indium (I) or other P-type materials may be used for P-type implants, and arsenic (As) or phosphorous (P) and other N-type materials may be used for N-type implants. For the PMOS well implants, the P+ implant may be implanted within a range from 10 to 80 keV, and at NMOS well implants, the boron implant B+ implant may be within a range of 0.5 to 5 keV, and within a concentration range of $1\times10^{13}$ to $8\times10^{13}$/$cm^2$. A germanium implant Ge+, may be performed within a range of 10 to 60 keV, and at a concentration of $1\times10^{14}$ to $5\times10^{14}$/$cm^2$. To reduce dopant migration, a carbon implant, C+ may be performed at a range of 0.5 to 5 keV, and at a concentration of $1\times10^{13}$ to $8\times10^{13}$/$cm^2$. Well implants may include sequential implant, and/or epitaxial growth and implant, of punch through suppression regions, screen regions having a higher dopant density than the punch through suppression region, and threshold voltage set regions (which previously discussed are typically formed by implant or diffusion of dopants into a grown epitaxial layer on the screening region).

In some embodiments the well formation 302 may include a beam line implant of Ge/B (N), As (P), followed by an epitaxial (EPI) pre-clean process, and followed finally non-selective blanket EPI deposition, as shown in 302A. Alternatively, the well may be formed using a plasma implant of B (N), As (P), followed by an EPI pre-clean, then finally a non-selective (blanket) EPI deposition, 302B. The well formation may alternatively include a solid-source diffusion of B(N), As(P), followed by an EPI pre-clean, and followed finally by a non-selective (blanket) EPI deposition, 302C. The well formation may alternatively include a solid-source diffusion of B(N), As(P), followed by an EPI pre-clean, and followed finally by a non-selective (blanket) EPI deposition, 302D. As yet another alternative, well formation may simply include well implants, followed by in-situ doped selective EPI of B (N), P (P). Embodiments described herein allow for any one of a number of devices configured on a common substrate with different well structures and according to different parameters.

Shallow trench isolation (STI) formation 304, which, again, may occur before or after well formation 302, may include a low temperature trench sacrificial oxide (TSOX) liner 304A at a temperature lower than 900° C. The gate stack 306 may be formed or otherwise constructed in a number of different ways, from different materials, and of different work functions. One option is a poly/SiON gate stack 306A. Another option is a gate-first process 306B that includes SiON/Metal/Poly and/or SiON/Poly, followed by High-K/Metal Gate. Another option, a gate-last process 306C includes a high-K/metal gate stack wherein the gate stack can either be formed with "Hi-K first-Metal gate last" flow or a and "Hi-K last-Metal gate last" flow. Yet another option, 306D is a metal gate that includes a tunable range of work functions depending on the device construction, N(NMOS)/P(PMOS)/N(PMOS)/P(NMOS)/Mid-gap or anywhere in between. In one example, N has a work function (WF) of 4.05V±200 mV, and P has a WF of 5.01V±200 mV.

Next, in Step 308, Source/Drain tips may be implanted, or optionally may not be implanted depending on the application. The dimensions of the tips can be varied as required, and will depend in part on whether gate spacers (SPCR) are used. In one option, there may be no tip implant in 308A. Next, in optional steps 310 and 312, PMOS or NMOS EPI layers may be formed in the source and drain regions as performance enhancers for creating strained channels. For gate-last gate stack options, in Step 314, a Gate-last module is formed. This may be only for gate-last processes 314A.

Die supporting multiple transistor types, including those with and without a punch through suppression, those having different threshold voltages, and with and without static or dynamic biasing are contemplated. Systems on a chip (SoC), advanced microprocessors, radio frequency, memory, and other die with one or more digital and analog transistor configurations can be incorporated into a device using the methods described herein. According to the methods and processes discussed herein, a system having a variety of combinations of DDC and/or transistor devices and structures with or without punch through suppression can be produced on silicon using bulk CMOS. In different embodiments, the die may be divided into one or more areas where dynamic bias structures, static bias structures or no-bias structures exist separately or in some combination. In a dynamic bias section, for example, dynamically adjustable devices may exist along with high and low $V_T$ devices and possibly DDC logic devices.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

Accordingly, the specification and drawings are to be regarded in an illustrative rather than a restrictive sense.

The invention claimed is:

1. A field effect transistor structure having a gate dielectric under a gate with length Lg, comprising:
 a substrate,
 a well in the substrate doped to have a first concentration of a dopant,
 an undoped channel under the gate dielectric and extending to a source and a drain,
 a screening region positioned in the well and under the gate dielectric, the screening region extending to the source and drain and having a second concentration of dopant greater than $5\times10^{18}$ dopant atoms per cm$^3$,
 at least one punch through suppression region having a third concentration of a dopant intermediate between the first concentration and the second concentration of dopant, with the punch through suppression region positioned in the well under the gate dielectric and beneath the screening region,
 a threshold voltage set region having a fourth dopant concentration intermediate between the second concentration and $5\times10^{17}$ dopant atoms per cm$^3$, with the threshold voltage set region positioned under and spaced from the gate dielectric, the threshold voltage set region extending to the source and drain.

2. The field effect transistor structure of claim 1, wherein the screening region is positioned at a depth below the gate dielectric of between about Lg/5 and about Lg/1.

3. The field effect transistor structure of claim 1, wherein the screening region is positioned at a depth below the gate dielectric of greater than Lg/2.

4. The field effect transistor structure of claim 1, wherein the channel comprises an epitaxially grown layer.

5. The field effect transistor structure of claim 1, wherein the channel is formed as a blanket epitaxial layer.

6. The field effect transistor structure of claim 1, wherein the screening region sets a depletion depth for the field effect transistor structure.

7. The field effect transistor structure of claim 1, wherein the threshold voltage set region is formed as an epitaxial layer.

8. The field effect transistor structure of claim 7, further comprising a shallow trench isolation region.

* * * * *

UNITED STATES PATENT AND TRADEMARK OFFICE
CERTIFICATE OF CORRECTION

PATENT NO. : 8,421,162 B2
APPLICATION NO. : 12/895813
DATED : April 16, 2013
INVENTOR(S) : Lucian Shifren et al.

It is certified that error appears in the above-identified patent and that said Letters Patent is hereby corrected as shown below:

Title page, item (73) Assignee: delete "Suvolta, Inc., Los Gatos, CA (US)" and insert --SuVolta, Inc., Los Gatos, CA (US)--.

Signed and Sealed this
Twenty-first Day of May, 2013

Teresa Stanek Rea
*Acting Director of the United States Patent and Trademark Office*